United States Patent
Janke

(10) Patent No.: US 7,288,786 B2
(45) Date of Patent: Oct. 30, 2007

(54) INTEGRATED CIRCUIT CONFIGURATION WITH ANALYSIS PROTECTION AND METHOD FOR PRODUCING THE CONFIGURATION

(75) Inventor: Marcus Janke, München (DE)

(73) Assignee: Infineon Technologies A.G., Munich (DE)

( * ) Notice: Subject to any disclaimer, the term of this patent is extended or adjusted under 35 U.S.C. 154(b) by 0 days.

(21) Appl. No.: 10/444,552

(22) Filed: May 23, 2003

(65) Prior Publication Data

US 2003/0205816 A1 Nov. 6, 2003

Related U.S. Application Data

(63) Continuation of application No. PCT/DE01/04198, filed on Nov. 8, 2001.

(30) Foreign Application Priority Data

Nov. 23, 2000 (DE) .............................. 100 58 078

(51) Int. Cl.
*H01L 23/58* (2006.01)
*H01L 21/66* (2006.01)

(52) U.S. Cl. .................... 257/48; 257/211; 438/17; 438/18

(58) Field of Classification Search ................. 257/48, 257/211, 758; 438/11, 14, 15, 17, 18
See application file for complete search history.

(56) References Cited

U.S. PATENT DOCUMENTS

| | | | |
|---|---|---|---|
| 4,434,361 A | 2/1984 | Meinguss et al. | 235/492 |
| 5,345,105 A | 9/1994 | Sun et al. | 257/659 |
| 5,861,652 A | 1/1999 | Cole et al. | 257/386 |
| 5,998,858 A | 12/1999 | Little et al. | 257/678 |
| 6,014,052 A | 1/2000 | Coupe, II | 327/525 |
| 6,064,110 A | 5/2000 | Baukus et al. | 257/652 |
| 6,091,080 A * | 7/2000 | Usui | 257/48 |
| 6,137,318 A | 10/2000 | Takaaki | 326/112 |
| 6,261,883 B1 | 7/2001 | Koubuchi et al. | |
| 6,284,627 B1 | 9/2001 | Ramm et al. | 438/455 |
| 6,334,206 B1 | 12/2001 | Wille | 716/8 |
| 6,422,473 B1 | 7/2002 | Ikefuji et al. | |
| 6,486,558 B2 * | 11/2002 | Sugiyama et al. | 257/758 |
| 6,496,119 B1 | 12/2002 | Otterstedt et al. | 340/653 |
| 6,717,267 B1 * | 4/2004 | Kunikiyo | 257/758 |
| 2003/0008432 A1 | 1/2003 | Kux et al. | 438/136 |

FOREIGN PATENT DOCUMENTS

| | | |
|---|---|---|
| EP | 0 378 306 A2 | 7/1990 |
| EP | 0 764 985 A2 | 3/1997 |
| EP | 0 948 052 A2 | 10/1999 |
| JP | 10-270562 | 10/1998 |
| JP | 2000-76140 | 3/2000 |
| JP | 2001-284357 | 10/2001 |
| RU | 1251138 A1 | 8/1986 |
| RU | 2 151 422 C1 | 6/2000 |
| WO | WO99/16131 | 4/1999 |
| WO | WO 00/28399 | 5/2000 |
| WO | WO 00/67319 | 11/2000 |

* cited by examiner

*Primary Examiner*—Hung Vu
(74) *Attorney, Agent, or Firm*—Laurence A. Greenberg; Werner H. Stemer; Ralph E. Locher

(57) ABSTRACT

During the creation of wiring plans for logic modules, the regions which are left free of interconnects by synthesis methods in upper metal planes are filled to a maximum degree with further interconnects. These interconnects serve to protect the integrated circuit. These further interconnects, depending on the availability of components for driving or evaluation, are embodied as sensor interconnects or else as connectionless interconnects only to confuse potential hackers.

10 Claims, 2 Drawing Sheets

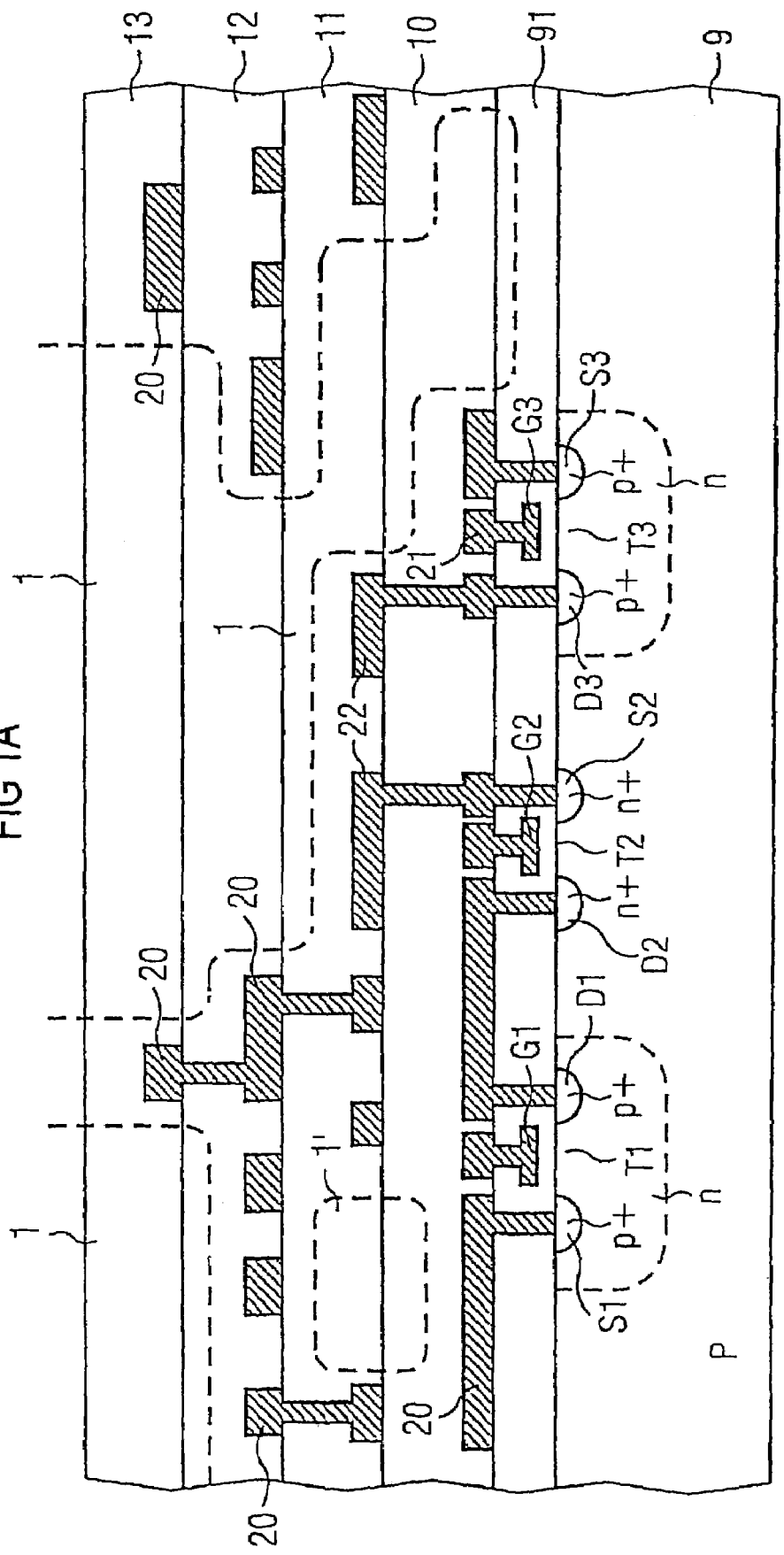

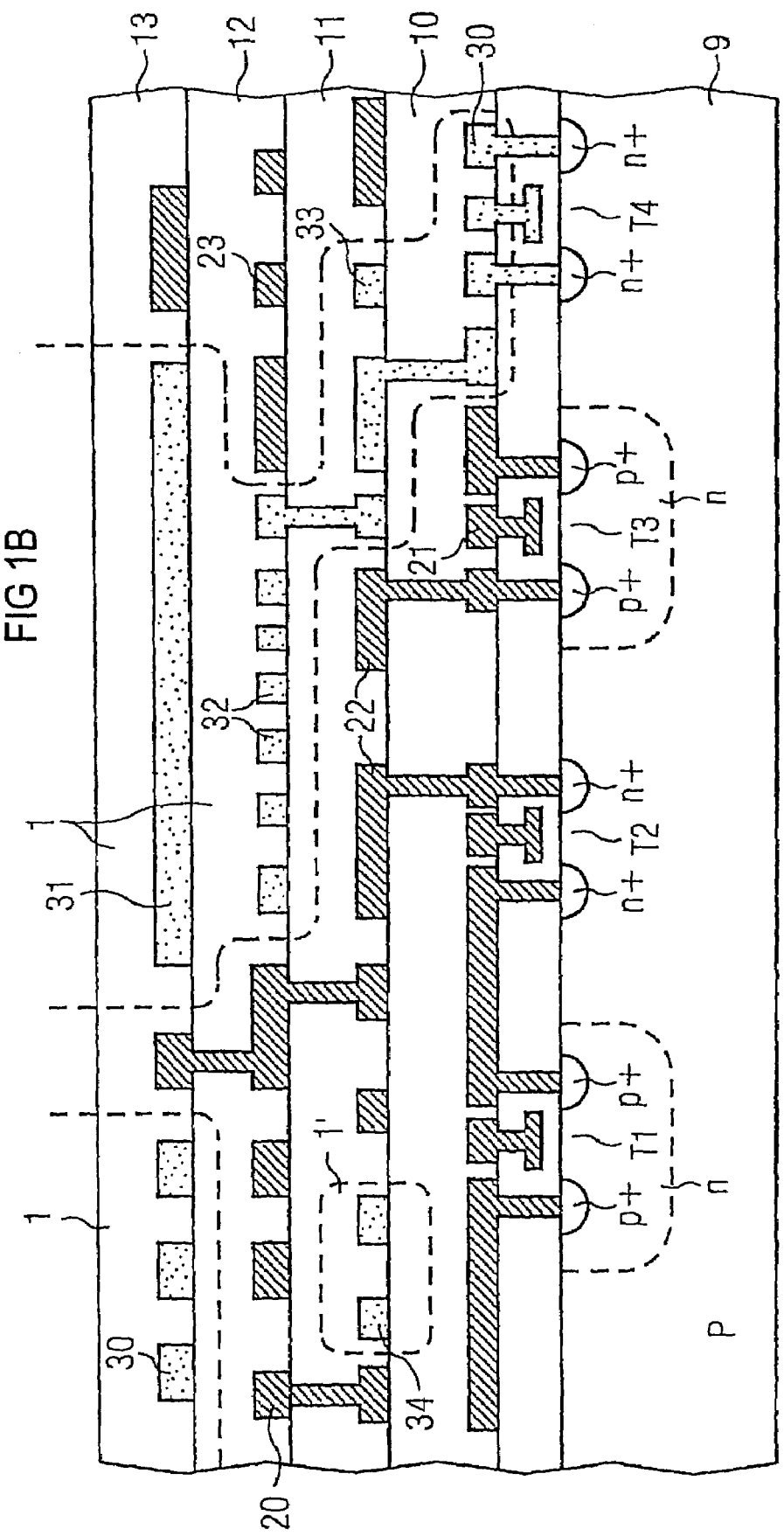

INTEGRATED CIRCUIT CONFIGURATION WITH ANALYSIS PROTECTION AND METHOD FOR PRODUCING THE CONFIGURATION

CROSS-REFERENCE TO RELATED APPLICATION

This application is a continuation of copending International application PCT/DE01/04198, filed Nov. 8, 2001, which designated the United States and which was not published in English.

BACKGROUND OF THE INVENTION

Field of the Invention

The invention lies in the integrated technology field. More specifically, the present invention relates to an integrated circuit configuration with a substrate, which has circuit elements, and a wiring plane with interconnects, and also to a method for producing an integrated circuit configuration.

In integrated circuits, particularly in their use in smart cards and chip cards, it is possible for a potential hacker to perform an analysis of the integrated circuit, so-called "reverse engineering", and to use the information obtained either to alter the mode of operation of the circuit or to perform a data manipulation in the memory thereof. The process can lead to undesirable consequences particularly in the case of security-relevant circuits, for instance with cash card or access authorization functions. The material covering the chip and also a part of the upper layers protecting the wiring of the chip are typically removed during the analysis. The upper interconnects that are then uncovered are usually non-security-relevant lines which can be bypassed by so-called bypass lines in order to reach farther to deeper layers and lines. With some outlay, these steps can be performed nowadays using the "FIB method" ("Focused Ion Beam"). As soon as deeper, security-relevant and thus critical lines are reached, either signals and pulses can be tapped off on the lines (so-called "probing"), or signals can be applied to these lines in order to manipulate data (so-called "forcing").

In the past, therefore, the object has been to prevent or at least render more difficult the analysis and manipulation of the integrated circuits; on the one hand, An attempt to achieve that object has involved concealed structuring of the critical lines in the wiring plan. On the other hand, that object has been tackled by application of a dedicated, covering protective plane above the relevant wiring planes. In the case of these protective planes, called "shields", meander-shaped or lattice-shaped lines are typically realized e.g. in pairs in the protective plane, in the event of whose interruption or short circuit for the case where different voltages are present the detecting sensor initiates an erasure of the memory, a reset or the non-functionality of other circuit sections. These lines, referred to as "passive" can likewise be embodied as unconnected, voltageless lines. In this case, they serve merely for increasing the complexity during the attack or for the purpose of confusion.

The security of the modules can be additionally increased by the passive lines described being replaced by so-called active lines in the design of the wiring plan. In the case of the active lines, signals are applied to the lines of the shield by drive circuits, which signals are analyzed by evaluation circuits and compared e.g. with reference signals owing to the possible variation of the signals, in this case the shield can only be circumvented by the very complicated laying of a bypass line by means of the FIB method.

While integrated circuits of conventional logic modules are created with an essentially manually controlled design (full-custom design), manual processing or influencing is possible only with a relatively high outlay in the case of the synthesized logic that is gaining acceptance to an ever greater extent nowadays.

In this method, functions and relationships of objects are formulated in a higher programming language, e.g. VHDL, and translated into a finished wiring plan by a compilation program. Since the protection properties of the shield lines result from functions that are independent of the actual circuit and also from their spatial position, but these cannot be fixed a priori in the synthesis method, in the case of that method it is unfortunately only afterwards that the wiring plan can be manually supplemented by protective planes, with outlay, which is in contrast to the desired efficiency and time advantage in the creation of the integrated circuit.

It is thereby precisely the integrated circuits that are created by a synthesis method that may be particularly vulnerable to hacker attack, because most of the wiring is effected in the deeper layers, while the occupancy with lines becomes less and less in the upper layers. As a result, it is possible for the potential attacker to reach the deep, security-relevant, critical lines directly e.g. from the peak measuring location using needles, without encountering lines lying in upper wiring planes.

SUMMARY OF THE INVENTION

It is accordingly an object of the invention to provide a integrated circuit configuration and a method for producing such a configuration which overcome the above-mentioned disadvantages of the heretofore-known devices and methods of this general type and which afford a high degree of protection against externally attacking analysis methods in conjunction with low complexity and low costs, particularly for the case where the wiring plan has been created in a synthesis process.

With the foregoing and other objects in view there is provided, in accordance with the invention, an integrated circuit configuration, comprising:

a substrate formed with circuit elements;

at least one wiring plane formed with first interconnects connecting the circuit elements and disposed to leave free spaces in the wiring plane; and second interconnects for protection of the integrated circuit configuration formed in the wiring plane and filling the free spaces in the wiring plane left free by the first interconnects.

In accordance with an added feature of the invention, there is provided a driving an evaluation circuit connected to the second interconnects, for detecting one of an interruption of the second interconnects, a short circuit of one of the second interconnects with a further interconnect, or a bypass of the second interconnects.

In accordance with an additional feature of the invention, the at least one wiring plane is one of a plurality of wiring planes, and at least one of the second interconnects extends over at least two of the wiring planes. In accordance with another feature of the invention, one of the second interconnects runs directly below or above one of the first interconnects.

In a preferred embodiment of the invention, the second interconnects are assigned to active lines.

With the above and other objects in view there is also provided, in accordance with the invention, a method of producing an integrated circuit configuration as outlined above, i.e., a circuit with a substrate, circuit elements, and at least one wiring plane with first interconnects. The novel method comprises generating a wiring plan for the integrated circuit, and thereby leaving regions of the wiring plane free of first interconnects and filling the regions with second interconnects for protection of the integrated circuit in the wiring plan.

A chip stack in which the analysis is to be prevented with interconnects is disclosed in the commonly assigned, published patent application US 2003/0008432 A1 and international publication WO 00/67319 A1, which are herewith incorporated by reference.

The present invention proposes an integrated circuit configuration in which a maximum occupancy of interconnects is made possible for each plane by filling the regions which are left free of the interconnects that support the intended function of the integrated circuit with the interconnects that serve for protection of the integrated circuit. On the one hand, for the potential attacker in the case of reverse engineering, this increases the number of interconnects to be examined per wiring plane; on the other hand, the potential attacker cannot ascertain from the outset which interconnects in the wiring plane serve for the actual integrated circuit and which serve only for the protection of this circuit. The advantage thus arises that the filling and the joint positioning of the two assignments of interconnects in a wiring plane leads to a considerably higher complexity in the case of reverse engineering.

The integrated circuit configuration according to the invention may comprise substrates with active circuit elements and those integrated circuit configurations without active circuit elements that are used e.g. as so-called flip-chips, the latter usually being turned and bonded by the patterned side again onto the structure side of a substrate comprising active circuit elements. These together again produce precisely a circuit configuration according to the invention.

It shall be expressly pointed out that in this document, according to the present invention, the term circuit elements also encompasses interconnects. Thus, the integrated circuit configuration according to the invention can also be employed in the above-mentioned flip-chips, e.g. merely comprising interconnects, which can accordingly serve as extended protection for a chip comprising active circuit elements.

The method for producing the configuration according to the present invention proves to be particularly advantageous for integrated circuits created using synthesis methods. Critical interconnects that are possibly not covered by interconnects in upper wiring planes in the synthesis method and are thus uncovered and at a deeper level can be covered, according to the present invention, by filling the left-free regions that lie precisely above the interconnect concerned with the interconnects serving for protection of the integrated circuit, after the end of the synthesis method. However, a conceivable application of the present invention before or during the synthesis method must also be taken into account through this teaching. The configurations and the method according to the present invention are preferably realized by means of a filling program which ideally follows the synthesis method. In addition to the speed advantage, this affords the possibility that by creating a new module version with alterations in the wiring plan of the integrated circuit, a completely new wiring plan of the protective lines is likewise created. Consequently, the analysis for reverse engineering concerns not only the examination of small alterations from one module version to the next, rather it is necessary for the analysis to be carried out completely anew with high outlay.

Since, in the present integrated circuit configuration, there is no need to provide a dedicated plane for protective interconnects, because the corresponding interconnects are situated in the already wired planes, no additional costs arise for the construction of metal planes. On the other hand, this economic advantage can also be obtained in the case of integrated circuits created in the full-custom design, if the corresponding protective interconnects are filled or placed into left-free regions of the manually assembled library modules or interconnects and supply tracks whilst dispensing with the dedicated protective plane that is usually used in this case.

A further aspect is constituted by the possible multilayer nature of regions with interconnects for protection of the integrated circuit. In addition to the complexity increase, that is provided by the multilayer nature, it is thus possible to combine different protective mechanisms, such as, for instance, capacitive censor lines in a first plane and signal and sensor lines provided with comparators in a second plane, by which the successive removal of planes and examination of interconnects is advantageously made considerably more difficult.

Other features which are considered as characteristic for the invention are set forth in the appended claims.

Although the invention is illustrated and described herein as embodied in integrated circuit configuration with analysis protection and method for producing the configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a cross section taken through an exemplary circuit configuration, created in a synthesis method, with transistors and interconnects in four metal planes in accordance with the prior art; and FIG. 1B is a cross section taken through an exemplary circuit device according to the invention, after filling, i.e., after application of the method according to the invention for producing the circuit configuration.

DESCRIPTION OF THE PREFERRED EMBODIMENTS

Referring now to the figures of the drawing in detail and first, particularly, to FIG. 1A thereof, there is shown a wiring plan—created by a synthesis method—of a prior art integrated circuit configuration. In the illustrated cross section of the exemplary configuration, three transistors T1, T2 and T3 are illustrated on a substrate 9. The transistors T1 and T2 constitute a CMOS inverter. The corresponding gate electrodes G1-G3 and also metal contacts to the source regions S1-S3 and drain regions D1-D3 of the three transistors are situated in an insulating layer 91 lying on the substrate. Situated on this layer is the first metal plane 10 with an insulation layer thereon, with the interconnects 20 serving for the wiring of the components. As is a result of crossovers of the interconnects 20, the latter also have to switch to higher metal planes 11, 12 and 13 that are mutually isolated by insulation layers. It is generally the case that, in particular, supply lines are laid in the topmost metal layers. The VHDL program code reflecting the relationships and modes of operation of the respective components is translated by a compilation program to produce an optimized wiring plan specifying e.g. the shortest possible wiring routes. As a result, the bottommost metal layer 10 is occupied to the greatest extent with interconnects, while this occupancy decreases to a greater extent towards upper metal layers. In this way, regions, 1, 1' which are left free of interconnects and which widen towards high metal layers are produced in the wiring plan, but the left-free regions 1' which are not utilized further by the compilation program can also be produced, which are surrounded and enclosed by interconnects.

In the context of this circuit configuration, a potential hacker, for the purpose of attack after removal of the insulation layers between the metal layers 10-13, could use e.g. needles to get at the safety-relevant interconnects 21 of the transistor T3, which are located in the first metal layer 10, or the interconnects 22 of the transistors T2, T3, which are additionally located in the second metal layer 11, in order to carry out probing or forcing here.

In accordance with the method—on which the present invention is based—for producing the integrated circuit configuration, the regions 1 which are left free of interconnects e.g. in the synthesis method are filled (i.e., populated) with further interconnects 30 serving for protection of the integrated circuit. This can be done manually but should ideally be realized by a computational filling program which detects the left-free regions and fills them with interconnects while complying with protective functions that are to be prescribed. In this case, regions that are possibly still free on the substrate can be utilized for the components of the sensor lines, such as the transistor T4 shown in FIG. 1B. In this case, the interconnects 30 serving as sensor lines fill the left-free regions 1 as densely as possible in order just by virtue of their position to impede access through needles from a point measurement location or through the FIB method to the critical interconnects 21, 22. As a result of the application of signals to the interconnects 30 by the evaluation and/or drive devices, which comprise e.g. transistors T4, it is possible to check the intactness of the interconnects 30 with respect to short circuit or bypassing by means of a comparison with a reference signal. If the signals are unequal, the evaluation device initiates, say, a reset or erasure of the memory of the integrated circuit.

The potential attack is made particularly more difficult by virtue of a lattice-shaped or meander-shaped shaping of the interconnects 31, 32. If the orientation of the interconnects 31 in the metal plane 13 is thereby chosen to be perpendicular to the interconnects 32 positioned in the underlying metal plane 12, then it becomes particularly difficult for the potential attacker to get to the underlying lines, since in this case, by cutting out the hole through which the needle or the FIB is intended to reach the interconnect 22, it is necessary to interrupt very many overlying interconnects 31 of the metal plane 13 and interconnects 32 of the metal plane 12, which the potential attacker then has to individually examine or bypass in each case.

A further advantage is afforded by the checking of interconnects of the integrated circuit which lie in upper metal layers by means of underlying interconnects serving for protection purposes. In FIG. 1B, this is illustrated by the interconnect 23 of the metal plane 12, below which the interconnect 33 runs parallel over the greatest possible length. Specifically, detection of the interruption of the interconnect 33 makes it possible to immediately infer the concurrent interruption of the interconnect 23 or an attack on the latter. It is safe to infer, then, that a hacking event has occurred and a change in the operating mode of the integrated circuit can be initiated by way of the evaluation logic unit.

Even for the case where left-free regions 11 cannot be reached by drive and/or evaluation devices, it is possible to provide connectionless interconnects 34 that serve only for the purpose of confusion. Furthermore, the generally implemented step of inserting a metal area for the stabilization of layer surfaces becomes superfluous as a result of filling with interconnects. Consequently, the security of the module is advantageously increased in conjunction with no or only little additional outlay.

I claim:

1. An integrated circuit configuration, comprising:
   a substrate formed with circuit elements;
   at least one wiring plane formed with first interconnects connecting said circuit elements and disposed to leave free spaces in said wiring plane;
   second interconnects for protection of the integrated circuit configuration against attacking analysis formed in said wiring plane and filling said free spaces in said wiring plane left free by said first interconnects, said second interconnects having a similar structure and appearance to said first interconnects in order to achieve a desired disguise, said second interconnects being formed as passive and voltaqeless interconnects, said second interconnects being lattice-shaped or meander-shaped;
   further elements connected to said second interconnects, said further elements not belonging to said circuit elements; and
   a driving circuit and an evaluation circuit connected to said second interconnects, for detecting one of an interruption of said second interconnects, a short circuit of one of said second interconnects with a further interconnect, or a bypass of said second interconnects.

2. The integrated circuit configuration according to claim 1, wherein said second interconnects are assigned to active lines.

3. A method of producing an integrated circuit configuration, the method which comprises:
   forming a substrate with circuit elements;
   forming at least one wiring plane with first interconnects connecting the circuit elements and disposed to leave free spaces in the wiring plane;
   forming second interconnects for protection of the integrated circuit configuration against attacking analysis in the wiring plane and filling the free spaces in the wiring plane left free by the first interconnects, the second interconnects having a similar structure and appearance to the first interconnects in order to achieve a desired disguise, the second interconnects being formed as passive and voltageless interconnects, the second interconnects being lattice-shaped or meander-shaped;
   providing further elements connected to the second interconnects, the further elements not belonging to the circuit elements; and
   forming a driving circuit and an evaluation circuit connected to the second interconnects, for detecting one of an interruption of the second interconnects, a short circuit of one of the second interconnects with a further interconnect, or a bypass of the second interconnects.

4. The method according to claim 3, which comprises, after the regions of a first wiring plane that are left free have been filled with second interconnects for protection of the integrated circuit,
filling regions of a second wiring plane left free of first interconnects with second interconnects for protection of the integrated circuit; and
producing connections between the interconnects of the first and second wiring planes in overlapping zones of the two regions.

5. The method according to claim 4, which comprising defining an orientation of two interconnects of the circuit configuration that are arranged one above the other perpendicular to one another in the overlapping zones.

6. The method according to claim 3, which comprises creating the wiring plan of the integrated circuit based on a synthesis method.

7. An integrated circuit configuration, comprising:
a substrate formed with circuit elements;
at least one wiring plane formed with first interconnects connected to said circuit elements and disposed to leave free spaces in said wiring plane;
second interconnects for protection of the integrated circuit configuration formed in said wiring plane and filling said free spaces in said wiring plane left free by said first interconnects, said second interconnects having a similar structure and appearance to said first interconnects in order to achieve a desired disguise; and
a driving circuit and an evaluation circuit connected to said second interconnects, for detecting one of an interruption of said second interconnects, a short circuit of one of said second interconnects with a further interconnect, or a bypass of said second interconnects.

8. The integrated circuit configuration according to claim 7, wherein said second interconnects are assigned to active lines.

9. The integrated circuit configuration according to claim 7, wherein said at least one wiring plane is one of a plurality of wiring planes, and at least one of said second interconnects extends over at least two of said wiring planes.

10. The integrated circuit configuration according to claim 9, wherein one of said second interconnects runs directly below or above one of said first interconnects.

* * * * *